United States Patent [19]

Nakagawa et al.

[11] Patent Number: 4,766,474
[45] Date of Patent: * Aug. 23, 1988

[54] HIGH VOLTAGE MOS TRANSISTOR

[75] Inventors: Kiyotoshi Nakagawa, Nara; Katsumi Miyano, Sakai; Takeo Fujimoto, Osaka, all of Japan

[73] Assignee: Sharp Kabushiki Kiasha, Osaka, Japan

[*] Notice: The portion of the term of this patent subsequent to Sep. 30, 2003 has been disclaimed.

[21] Appl. No.: 267,643

[22] Filed: May 27, 1981

[30] Foreign Application Priority Data

May 30, 1980 [JP] Japan .................................. 55-73917

[51] Int. Cl.$^4$ ...................... H01L 29/78; H01L 29/52
[52] U.S. Cl. .................................... 357/23.8; 357/53; 357/59
[58] Field of Search .................. 357/23, 53, 54, 63, 357/72, 73, 84

[56] References Cited

U.S. PATENT DOCUMENTS

| | | | |
|---|---|---|---|
| T964,009 | 11/1977 | Chiu et al. | 357/23 |
| 3,841,926 | 10/1974 | Garnache et al. | 357/53 |
| 3,890,698 | 6/1975 | Clark | 357/53 |
| 3,967,310 | 6/1976 | Horiuchi et al. | 357/54 |
| 4,009,483 | 2/1977 | Clark | 357/53 |
| 4,079,504 | 3/1978 | Kosa | 29/571 |
| 4,157,563 | 6/1979 | Bosselaar | 357/53 |
| 4,172,260 | 10/1979 | Okabe et al. | 357/23 |
| 4,199,774 | 4/1980 | Plummer | 357/23 |
| 4,270,137 | 5/1981 | Coe | 357/53 |
| 4,288,803 | 9/1981 | Ronen | 357/41 |
| 4,292,729 | 10/1981 | Powell | 29/571 |
| 4,614,959 | 9/1986 | Nakagawa | 357/23.8 |

FOREIGN PATENT DOCUMENTS

| | | | |
|---|---|---|---|
| 963174 | 2/1975 | Canada | 357/53 |
| 2031082 | 4/1971 | Fed. Rep. of Germany | 357/53 |
| 54-37584 | 3/1979 | Japan | 357/53 |
| 300472 | 4/1968 | Sweden | 357/53 |

Primary Examiner—Andrew J. James
Assistant Examiner—John LaMont
Attorney, Agent, or Firm—Birch, Stewart, Kolasch & Birch

[57] ABSTRACT

A MOS transistor is featured by providing mult-layered covering elements for covering a channel region of the semiconductor device. Each of the covering elements is interposed by an insulating layer. Preferably, the covering layers comprise first and second covering layers neither of which are connected to either of the drain electrode, the source electrode, or the gate electrode. A field plate layer, as a third covering layer, is disposed over the first and second covering layers.

3 Claims, 2 Drawing Sheets

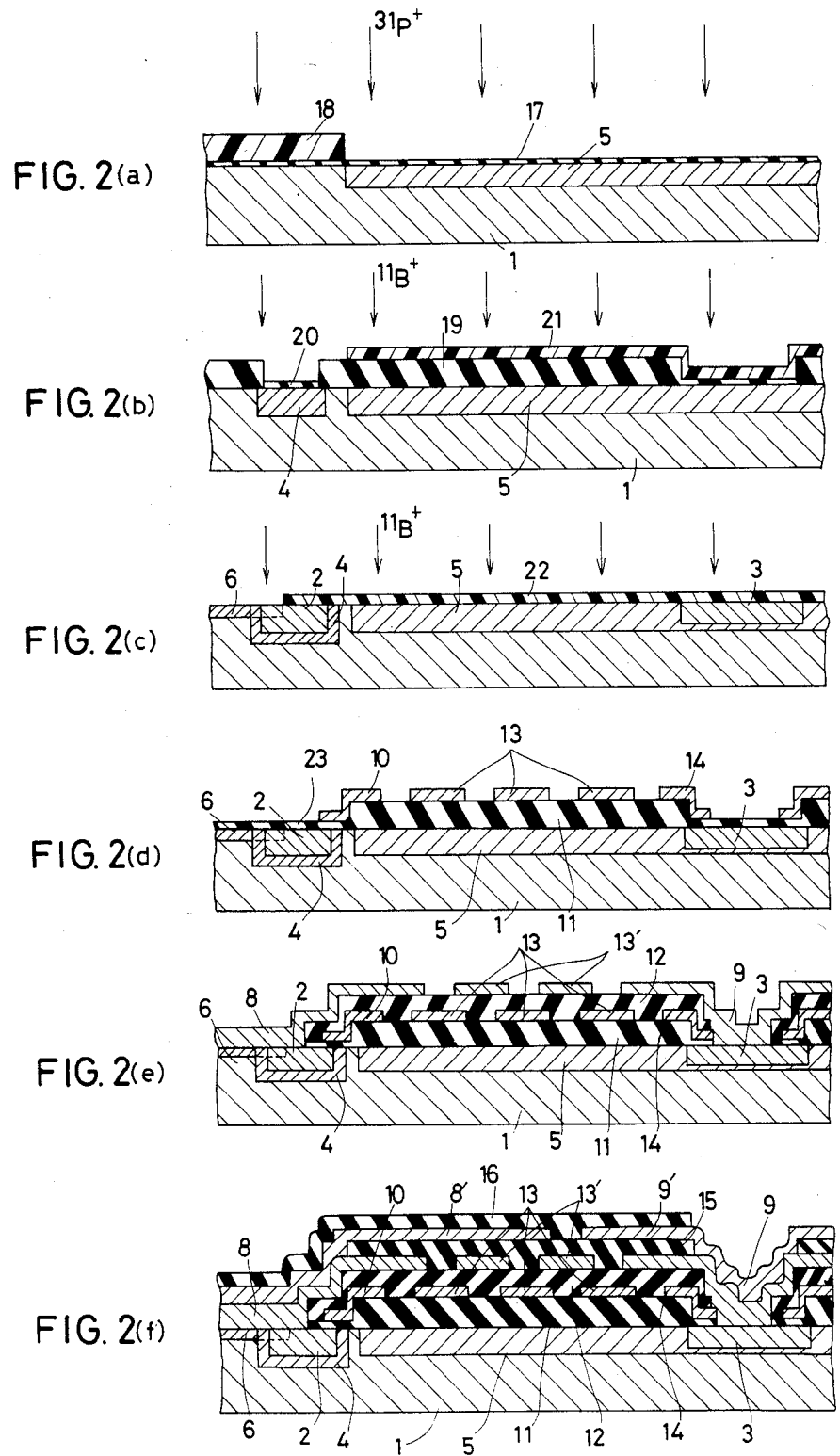

HIGH VOLTAGE MOS TRANSISTOR

BACKGROUND OF THE INVENTION

The present invention relates to a metal oxide semiconductor (MOS) transistor and, more particularly, to a high voltage MOS transistor.

To establish an improved high voltage MOS transistor by preventing field concentration near an edge of a gate electrode, an attempt has b een mde in which there has been additionally provided a high resistant layer adjacent a drain as a part of the drain region, the conductivity type of the high resistant layer being the same as the drain.

The conventional transistor comprises a P type substrate, an N+ type source region, an N+ type drain region, a P+ region, an N− type high resistant layer, a source electrode, a drain electrode, insulating layers, a gate electrode, field plate layers, and an additional field plate layer made of Al, polycrystalline silicon, or the like.

The P+ type region surrounds the N+ type source region for providing a gate channel for the transistor. The layer is formed by a diffusion-self-alignment process. A high voltage diffusion-self-alignment MOS transistor is described in Awane et al U.S. Pat. No. 4,058,822 issued Nov. 15, 1977, assigned to the present assignee, entitled "HIGH VOLTAGE, LOW ON-RESISTANCE DIFFUSION-SELF-ALIGNMENT METAL OXIDE SEMICONDUCTOR DEVICE AND MANUFACTURE THEREOF". The disclosure of this patent is incorporated herein by reference.

Around the N+ type drain region, the N− type high resistant layer is provided for preventing field concentration at the edge of the gate electrode. The layer constitutes a part of the drain region. Each of the source electrode and the drain electrode is composed of Al, polycrystalline silicon, or the like. Each of the field plate layers extends from each of the source electrode and the drain electrode. The gate electrode is made of Al or polycrystalline silicon, called a silicon gate.

The field plate layer which extends frrom the source electrode functions to reduce field concentration at the edges of the gate electrode. The field plate layer which extends from the drain electrode· function to reduce field concentration at the boundary between the N+ type layer and the N− type layer.

If one of the field plate layers extends over a suitable limitation, a reverse field plate effect may be generated which is applied to the drain portion by the layer or to the edge of the gate electrode by the layer which extends from the source electrode. This reduces the value of a sustained voltage.

To eliminate the generation of the reverse field plate effect, the above-mentioned structure of the transistor includes a region of the N− type high resistant layer, not covered with the field plate layers, made of Al or the polycrystalline silicon. However, the amount of a sustainable voltage in the ON condition, the amount of the drain current and the value of $R_{ON}$, will inevitably undesirably vary according to this structure.

SUMMARY OF THE INVENTION

In view of the foregoing, it is an object of the present invention to provide an improved high voltage MOS transistor for eliminating the above-stated disadvantages.

It is another object of the present invention to provide an improved high voltage MOS transistor comprising a high resistance portion adjacent a drain region, the high resistance portion being substantially and completely covered by two or more covering layers to thereby prevent effect by externally applied charges, referred to as a field plate effect.

Briefly described, the MOS transistor of the present invention is featured by providing multi-layered conductive covering elements for covering a drift channel region of the semiconductor device.

Each combination of the covering elements are interposed by an insulating layer. Preferably, the covering layers comprise first and second covering layers neither of which are connected to either of the drain electrode, the source electrode, or the gate electrode.

The field plate layers as a third covering layer, is disposed over the first and second covering layers.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 2(a) through 2(f) show manufacturing steps for preparing the transistor of FIG. 1.

DESCRIPTION OF THE INVENTION

Figure 1:
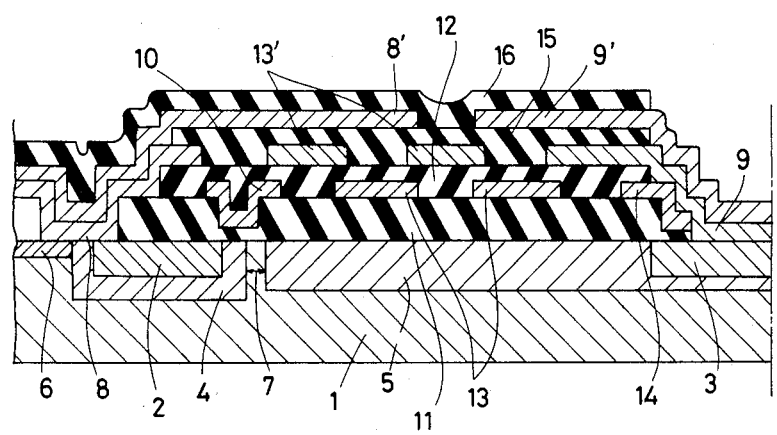
FIG. 1 shows a sectional view of a specific example of a high voltage MOS transistor according to the present invention.

FIG. 1 shows an example of a high voltage MOS transistor according to the present invention. The transistor comprises a P type semiconductor substrate 1, and N+ type source region 2, an N+ type drain region 3, a P+ type region 4, and N− type pinch high resistance layer 5, a field dope region 6, a source electrode 8, a drain electrode 9, a gate electrode 10, insulating layers 11, 12 and 15, field plates 8′, 9′ and 14, a protective insulating layer 16, and floating conductive elements 13 and 13′.

The P+ type region 4 is formed around the N+ type source region 2 by diffusion self allignment techniques. The region 4 is for the purpose of providing a gate channel of this MOS transistor. The N− type pinch high resistance layer 5 is connected to the N+ type drain region 3. The source electrode 8 is connected to the N+ type source region 2. The drain electrode 9 is coupled to the N+ type drain region 3.

The field plate 14, preferably, made of polycrystalline silicon extends from the drain electrode 9. The end of the N− type pinch high resistance layer 5 not connected to the drain region 3 is separated from the P+ type channel region 4 to provide a separation 7 of P− type. The field dope region 6 which is produced by doping with an impurity to make a P+ type layer. The region 6 is positioned outside the region 4. The source electrode 8 connected to the region 2 is also connected to the P+ channel region 4 and the field dope region 6.

Improvement of cut-off sustain voltage and operating sustain voltage by a high voltage bias, called ON sustain voltage, is achieved by the provision of the separated portion 7, and the connection between the P+ channel region 4, the source region 2, and the field dope region 6.

As a feature of the present invention, the field plates 8′ and 9′ are disposed on the third insulating layer 15 while each of the field plates 8' and 9' extends from each of the source electode 8 and the drain electrode 9 respectively. Together with the floating conductive elements 13 and 13', the field plates 8' and 9' function to completely cover the N⁻ type high resistance layer 5 so that reliability of the MOS transistor is improved. Further the two or more floating conductive elements as indicated by 13 and 13' electrically shield the N⁻ type pinch high resistance layer 5 from influence by the field plates 8' and 9' so that good properties in sustaining the voltage for the transistor are obtained.

Manufacturing steps for the transistor of FIG. 1 are described in FIGS. 2(a) to 2(f).

FIG. 2(a): The P type semiconductor substrate 1 has a small density of impurity. A resist 18 is provided for covering parts in which the source region and the channel region are to be formed. Implantation of $^{31}P^+$ ion is conducted through an oxide film 17 covering the total surface of this substrate 1. This implanted impurity is thermally treated to provide diffusion for the purpose of making the N⁻ type pinch high resistance layer 5.

FIG. 2(b): A thick oxide film 19 is prepared by the thermal treatment in an oxidizing atmosphere in the step of FIG. 2(a). The oxide film 19 is windowed at the source and the drain regions technique formed by photo etching technique. A thin oxide film 20 is formed at these regions, thereafter. While a resist 21 is covering partial points of this surface, ion implantation of $^{11}B^+$ and diffusion treatment from the surface are to prepare the P+ type channel region 4. The region 4 is separated from the pinch high resistance layer 5 by a separation 7.

FIG. 2(c): Two N+ type regions are prepared by diffusion or ion implantation to provide the source region 2 and the drain region 3. Thereafter, the oxide films 19 and 20 are removed.

A resist layer 22 is partially positioned on the surface. Ion implantation of $^{11}B^+$ is applied to provide the P+ type field dope region 6.

FIG. 2(d): A thick oxide film 11 is prepared on the surface by using chemical vapor deposition. Parts of this film 11 for the drain, the gate and the source regions are removed. A thin oxide film 23 is formed on these parts. A layer, preferably, made of polycrystalline silicon is deposited on the entire surface. After an N+ doping and diffusion the layer is etched to remove unrequired portions so that each of the gate electrode 10, the floating conductive elements 13, and the field plate 14 are prepared.

FIG. 2(e): Over the entire surface of the substrate 1, a film 12 made of phospherous silicate glass is formed having a window opposed to each of the source electrode region and the drain electrode region. A layer, preferably, made of Al is deposited on the entire surface and unrequired portions are removed. All of the source electrode 8, the drain electrode 9, and the floating conductive elements 13' are prepared.

The floating conductive elements 13 are disposed on the insulating layer 11 for the purpose of discretely covering the layer 5. The floating conductive elements 13' are disposed on the insulating layer 12 for the purpose of discretely covering the layer 5. The floating conductive elements 13 and 13', in combination, completely cover the layer 5.

FIG. 2(f): the insulating layer 15, preferably, made of phospherous silicate glass is prepared by chemical vapor deposition on the entire surface, having a window opposed to each of the drain electrode region and the source electrode region. A layer, preferably, composed of Al is layered on the entire surface and unrequired portions are removed. The field plate 8' and 9' are outlined.

Both of the field plates 8' and 9' function to additionally cover, via the layer 15, the layer 5 which has been covered by the floating conductive elements 13 and 13'. This attempt is to extensively cover the layer 5. Therefore, each of the ends of the field plates 8' and 9' are rather near.

The protecting insulating layer 16 is provided for covering the semiconductor device, whereby the transistor is completed.

Each of the floating conductive elements 13 and 13' can be composed of polycrystalline silicon, Al, Mo, W or the like.

The structure of the MOS FET of FIG. 1 can be modified to form two or more blocks as floating conductive elements similar to the elements 13 and 13'. Further, the insulating layers 11, 12 and 15 can be made by any type of insulating films such as those made of Local Oxidation of Silicon (LOCOS).

The gist of the present invention can be adapted to another type of MOS FET failing to present either or both of the N⁻ type pinch high resistance layer 5 and the P+ type region 4.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An high voltage metal oxide semiconductor device comprising:
    a semiconductor substrate having a conductivity of a first type;
    a source region having a conductivity of a second type opposite to that of said semiconductor substrate;
    a channel region of the same conductivity type as said semiconductor substrate formed adjacent to and substantially surrounding said source region;
    a field dope region positioned lateral to said first channel region;
    a source electrode above and connected to said source region, said channel region and said field dope region;
    a pinch high resistance region of said second type conductivity medial to a drain region and medial to and spaced from said channel region by a portion of said semiconductor substrate;
    a first insulating layer overlying said channel region and said pinch high resistance region;
    a drain region having a conductivity of said second type opposite that of said semiconductor substrate lateral to said pinch high resistance region opposite said source region;
    a drain electrode connected to said drain region;
    a gate electrode formed above said channel region having said first insulating layer interpositioned therebetween;
    first covering layer for covering said pinch high resistance region, said first covering layer comprising at least one floating conductive element, disposed on said first insulating layer, said first insulating layer interpositioned between said covering layer and said pinch high resistance region and second covering layer comprising at least one floating conductive element, disposed on a second insulating layer, said first and second covering layers substantially completely covering said pinch high resistance region;

a third insulating layer disposed on said second covering layer; and a third covering layer comprising first and second field plates disposed on said third insulating layer over said first and second covering layers, said first field plate extending from said source electrode and said second field plate extending from said drain electrode.

2. The device of claim 1, wherein either of said first and second covering layers is composed of at least one of a polycrystalline silicon, Al, Mo, or W.

3. The device of claim 1, wherein said third covering layer comprising said first and second field plates is electrically shielded from said second channel region by said first and second covering layers.

* * * * *